United States Patent
Sun

(10) Patent No.: US 10,201,073 B2
(45) Date of Patent: Feb. 5, 2019

(54) MULTI-LAYER PRINTED CIRCUIT BOARD AND A WIRELESS COMMUNICATION NODE

(71) Applicant: Telefonaktiebolaget LM Ericsson (publ), Stockholm (SE)

(72) Inventor: Xuejun Sun, Beijing (CN)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/515,242

(22) PCT Filed: May 31, 2016

(86) PCT No.: PCT/CN2016/084026
§ 371 (c)(1),
(2) Date: Mar. 29, 2017

(87) PCT Pub. No.: WO2017/206049
PCT Pub. Date: Dec. 7, 2017

(65) Prior Publication Data
US 2018/0192508 A1 Jul. 5, 2018

(51) Int. Cl.
*H04B 1/40* (2015.01)
*H04M 1/02* (2006.01)
(Continued)

(52) U.S. Cl.
CPC ........... *H05K 1/0218* (2013.01); *H01L 25/00* (2013.01); *H01Q 1/246* (2013.01); *H01Q 1/38* (2013.01);
(Continued)

(58) Field of Classification Search
CPC ................. H05K 1/0218; H05K 1/181; H05K 2201/0723; H05K 2201/10098;
(Continued)

(56) References Cited

U.S. PATENT DOCUMENTS 9,936,571 B2 * 4/2018 Lam ...................... H05K 1/0245
2009/0153423 A1 * 6/2009 Dinallo ................ H01Q 1/2283
343/767
(Continued)

FOREIGN PATENT DOCUMENTS

CN 101728369 A 6/2010

OTHER PUBLICATIONS

International Search Report and Written Opinion dated Feb. 13, 2017 in International application No. PCT/CN2016/084026, 7 pages.

*Primary Examiner* — Andrew Wendell
(74) *Attorney, Agent, or Firm* — Rothwell, Figg, Ernst & Manbeck, p.c.

(57) ABSTRACT

A multi-layer Printed Circuit Board PCB and a wireless communication node are disclosed in the present invention. The multi-layer PCB which is to be assembled in the communication node may include multiple radio layers (501) on one side of the PCB and at least one antenna layer (502) on another side of the PCB. At least one radio component is to be mounted on a surface layer of the multiple radio layers and at least one antenna element is to be patched on a surface layer of the at least one antenna layer. In such way, legacy connectors from the filter unit respectively to the antenna unit and the radio unit in conventional PCB can be left out to decrease the size of the PCB.

14 Claims, 3 Drawing Sheets

(51) Int. Cl.
*H05K 1/02* (2006.01)
*H01L 25/00* (2006.01)
*H01Q 1/38* (2006.01)
*H05K 1/18* (2006.01)
*H01Q 1/24* (2006.01)
*H01Q 9/00* (2006.01)
*H01Q 9/04* (2006.01)
*H05K 1/16* (2006.01)
*H04B 7/0413* (2017.01)

(52) U.S. Cl.
CPC ............. *H01Q 9/00* (2013.01); *H01Q 9/0407* (2013.01); *H04B 1/40* (2013.01); *H05K 1/165* (2013.01); *H05K 1/181* (2013.01); *H04B 7/0413* (2013.01); *H05K 2201/0723* (2013.01); *H05K 2201/1006* (2013.01); *H05K 2201/10098* (2013.01); *H05K 2201/10522* (2013.01)

(58) Field of Classification Search
CPC . H05K 2201/1006; H05K 2201/10522; H04B 1/04; H04B 1/40; H04B 7/0413; H01Q 1/38; H04M 1/0277
See application file for complete search history.

(56) References Cited

U.S. PATENT DOCUMENTS

| | | | |
|---|---|---|---|
| 2009/0180260 A1* | 7/2009 | Djordjevic | H05K 1/115 361/736 |
| 2012/0169543 A1* | 7/2012 | Sharma | H01Q 9/0421 342/458 |
| 2013/0078917 A1* | 3/2013 | Cho | H01Q 1/243 455/41.1 |
| 2013/0207274 A1 | 6/2013 | Liu et al. | |
| 2017/0309991 A1* | 10/2017 | Noori | H01Q 1/243 |

* cited by examiner

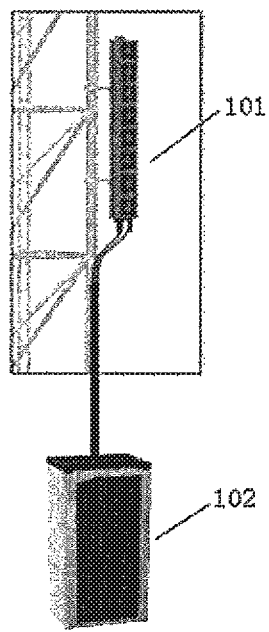
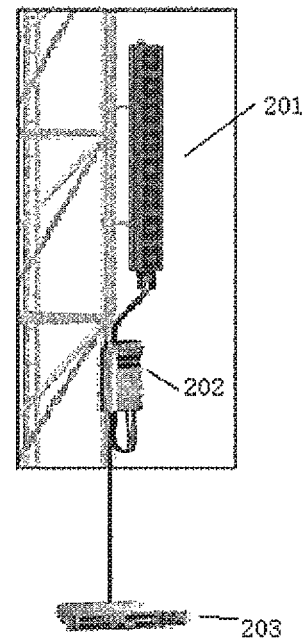
Fig. 1                    Fig. 2

MULTI-LAYER PRINTED CIRCUIT BOARD AND A WIRELESS COMMUNICATION NODE

CROSS-REFERENCE TO RELATED APPLICATION(S)

This application is a 35 U.S.C. § 371 National Phase of International Patent Application No. PCT/CN2016/084026, filed May 31, 2016, and designating the United States.

TECHNICAL FIELD

The present disclosure generally relates to the technical field of telecommunication, and particularly to a multi-layer Printed Circuit Board, and a wireless communication node.

BACKGROUND

This section is intended to provide a background or context to the invention that is recited in the claims. The description herein may include concepts that could be pursued, but are not necessarily ones that have been previously conceived, implemented or described. Therefore, unless otherwise indicated herein, what is described in this section is not prior art to the description and claims in this application and is not admitted to the prior art by inclusion in this section.

In telecommunication system, an access node or access point facilitates wireless communication between a terminal device, such as user equipment (UE), with a core network. An access node is also referred to as radio base station (RBS), node B (in 3G Networks), base transceiver station (BTS), evolved Node B (eNB) or, base station (BS). It mainly consists of three basic portions, a baseband unit, a radio unit and an antenna unit. The baseband unit is used for baseband signal processing such as modulation/demodulation, encoding/decoding, pre-coding, channel estimation and equalization, etc. The radio unit is used for frequency conversion to high band (Downlink) or to lower band (Uplink), output power amplification is also implemented in radio unit. Antenna unit comprising antenna elements is to transmit and receive radio frequency (RF) signal through air interface.

In a traditional macro configuration, baseband unit is physically bound to radio unit. In real deployment, both of the baseband unit and the radio unit are put together in a cabinet (102) as shown in FIG. 1 on the ground, while antenna unit (101) is always horizontally higher than the radio unit, usually located at the top of buildings in the city or on the mountains in countryside, to ensure the transmission and reception of electromagnetic waves. Long jumper cable is used to connect the radio unit and the antenna unit (101) in FIG. 1.

Along with development of technology, main-remote concept was raised during the evolution of access node. Radio unit (202) is not necessarily close to baseband unit (203) but installed considerably close to antenna unit (201), shown in FIG. 2. However, connection between antenna unit (201) and radio unit (202) still relies on jumper cable.

In recent years, antenna integrated radio unit (AIR) was designed to put radio unit and antenna unit into one physical "box" (301) as shown in FIG. 3. Long cable is needed between the physical box (301) and baseband unit (302). When a concept of Multiple In and Multiple Out (MIMO) became popular, number of antenna element has been increased from one or two to eight or even 16. On the other hand, antenna technology development turned it into reality that antenna element can be made into planar antenna element and be patched onto an antenna layer.

FIG. 4 illustrates how a radio unit and an antenna unit are connected in a same physical block of an AIR model. Radio Unit (401) includes a multi-layer Printed Circuit Board (PCB) with several radio components mounted on one side of the radio PCB. Antenna Unit (403) includes an antenna PCB and several antenna elements patched on one side of the antenna PCB. A Filter Unit (402) is between the radio PCB and antenna PCB to filter out unnecessary interference outside required spectrum. Each side of the filter unit is connected to the other side of the radio PCB and the antenna PCB respectively. Signals transmitted between the radio unit and antenna unit go through the wired connection.

In the above mentioned MIMO system, a plurality of antenna elements are designed to transmit signals through a plurality of radio branches. Assuming N radio branches are designed, there are N connectors between a filter unit and an antenna unit, and N connectors between the filter unit and a radio unit. The larger the N is, the more connectors are needed. Not only the cost of the connectors is rather high, but the difficulty of assembling the 2N connectors is considerable especially N increases to 64 which is popular in the $4^{th}$ generation (4G) telecommunication system.

SUMMARY

In view of at least one of the above considerations, various embodiments of the present technology have been made. The present disclosure proposes to integrate an antenna part and a radio part into one printed circuit board assembled in a communication node, so as to leave out legacy connectors from the filter unit respectively to the antenna unit and the radio unit.

According to an aspect of the disclosure, a multi-layer Printed Circuit Board in a wireless communication node is provided. The PCB comprises:
multiple radio layers on one side of the PCB, wherein at least one radio component is to be mounted on a surface layer of the multiple radio layers; and
at least one antenna layer on another side of the PCB, wherein an antenna element is to be patched on a surface layer of the at least one antenna layer.

According to a further embodiment of the disclosure, the PCB further comprises an isolator layer between the multiple radio layers and the at least one antenna layer.

According to a further embodiment of the disclosure, where the at least one radio component comprises a surface mounted filter.

According to a further embodiment of the disclosure, where the at least one radio component comprises one or more baseband components.

According to a further embodiment of the disclosure, the wireless communication node is a terminal device or an access node.

According to another aspect of the disclosure, a communication node in wireless telecommunication system is provided. The communication node comprises:
a multi-layer PCB;
at least one radio component being mounted on a surface layer of the multi-layer PCB; and
an antenna element being patched on another surface layer of the multi-layer PCB; wherein the multi-layer PCB comprising:
multiple radio layers including the surface layer on which the at least one radio components are mounted; and at least one antenna layer including the other surface layer on which the at least one antenna element is patched.

According to a further embodiment of the disclosure, the multi-layer PCB in the communication node further comprises:

an isolator layer between the multiple radio layers and the at least one antenna layer.

According to a further embodiment of the disclosure, the at least one radio component in the wireless communication node comprises a surface mounted filter.

According to a further embodiment of the disclosure, the at least one antenna element comprises one or more of: high frequency antenna element, super high frequency antenna element or ultra high frequency antenna element.

According to a further embodiment of the disclosure, the wireless communication node is in a Multiple Input Multiple Output MIMO system.

According to a further embodiment of the disclosure, the wireless communication node is an access node or a user equipment.

With the embodiments of the disclosure, in a wireless communication node, legacy connectors between a filter unit and an antenna unit, and connectors between the filter unit and a radio unit are left out, while an antenna part and a radio part are integrated into a single PCB. In this way, the PCB can be reduced in size and increase in reliability. The cost of the connectors can be saved and the assembling of the communication node can be simplified. What's more, the communication node can be designed in a more efficient manner.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure, therefore, not to be considered limiting of its scope, the disclosure will be described with additional specificity and detail through use of the accompanying drawings.

FIG. 1 illustrates an exemplary of wired connection between an antenna unit and a radio unit to which a baseband unit is bound.

FIG. 2 illustrates an exemplary of wired connection between an antenna unit and a radio unit in the prior art.

DETAILED DESCRIPTION

Hereinafter, the present disclosure is described with reference to embodiments shown in the attached drawings. However, it is to be understood that those descriptions are just provided for illustrative purpose, rather than limiting the present disclosure. Further, in the following, descriptions of known structures and techniques are omitted so as not to unnecessarily obscure the concept of the present disclosure.

The present disclosure proposes to integrate an antenna part and a radio part into a single integral printed circuit board (PCB) which is to be assembled in a wireless communication node. What's more, the present disclosure provides a wireless communication node in which the integral PCB is assembled.

Figure 3:
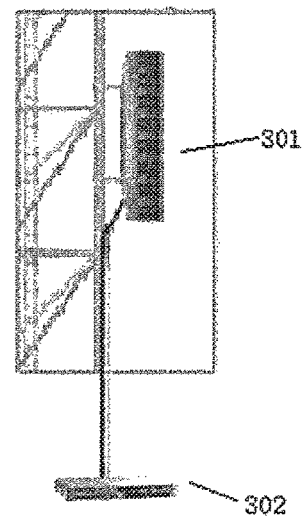
FIG. 3 illustrates an exemplary of an antenna integrated radio unit which is connected to a baseband unit through a cable.
Figure 4:
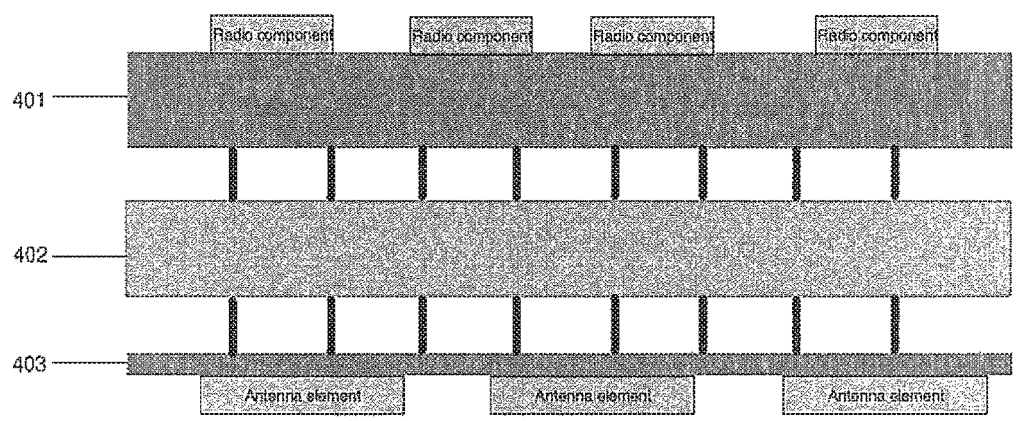
FIG. 4 provides a cross sectional view showing wired connections between a radio PCB and a filter unit, an antenna PCB and the filter unit, respectively, in an antenna integrated radio unit.
Figure 5:
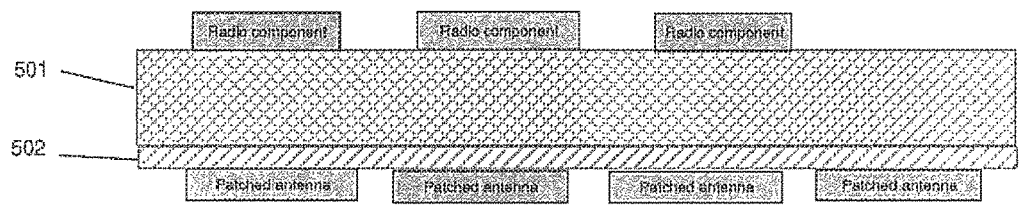
FIG. 5 provides a cross sectional view of radio part and antenna part being integrated into an entire multi-layer PCB according to one of the disclosed communication node embodiments.

FIG. 5 shows a cross sectional view illustrating one of our proposed embodiments. An embodiment provides a multi-layer Printed Circuit Board in a wireless communication node. The PCB comprises:

multiple radio layers (501) on one side of the PCB, wherein at least one radio component is to be mounted on a surface layer of the multiple radio layers; and at least one antenna layer (502) on another side of the PCB, wherein at least one antenna element is to be patched on a surface layer of the at least one antenna layer.

Figure 6:
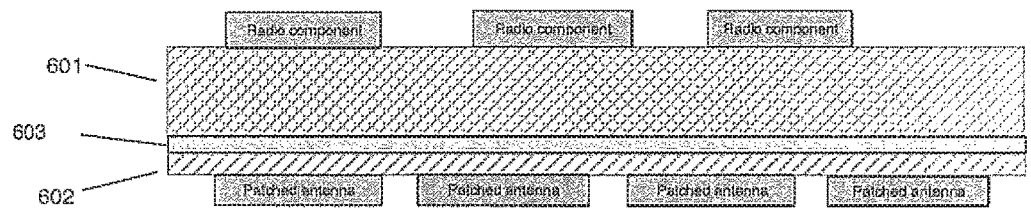
FIG. 6 provides a cross sectional view of radio part and antenna part being integrated with an isolator layer into an entire multi-layer PCB according to one of the disclosed communication node embodiments.

In order to describe the invention in greater detail, the preferred embodiments will be outlined below with reference to the accompanying figures. In an embodiment shown in FIG. 6 the above mentioned multi-layer PCB further comprise an isolator layer (603) between the multiple radio layers and the at least one antenna layer. The isolator layer is mainly to shield the multiple radio layers from radiation of the at least one antenna element, so that signal processing and transmitting by the at least one radio component and the multiple radio layers would not be interfered by the electromagnetic radiation of the antenna element(s).

In a further embodiment, the isolator layer (603) is mainly made of copper or gold-copper alloy. Alternatively, the isolator layer includes a substrate coated with copper or some metal alloy. In a more detailed embodiment, the thickness of the isolator layer is preferably similar to average thickness of a layer in the multi-layer PCB, such as between 0.2~0.3 mm. However, this is not the present disclosure mainly focusing on.

Figure 7:
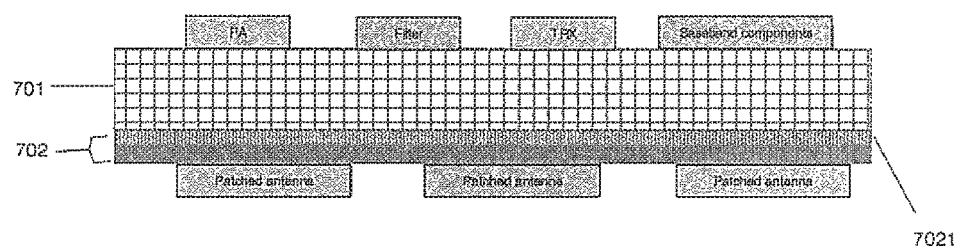
FIG. 7 provides an explanatory structure of a communication node with assembled multi-layer PCB according to an embodiment of the disclosure.

Referring to FIG. 7, in another embodiment, the above mentioned multi-layer PCB further comprises ground planes respectively included in the multiple radio layers (701) and the at least one antenna layer (702). Ground plan in the multiple radio layers may be designed to keep away from antenna radiation without an isolator layer between the multiple radio layers and the at least one antenna layer. Ground plane in the at least one antenna layer is designed to decrease radiation influence upon the at least one radio component. More specifically, the at least one antenna layer comprise an entire layer (7021) of the ground plane which is next to the multiple radio layers (701). For radiation isolation and heat dissipation in order to omit the isolator layer, the thickness of the ground plane layer of the at least one antenna layer is preferably between 0.5~0.8 mm, compared to 0.2~0.3 mm thickness of the isolator layer as proposed above.

Figure 8:
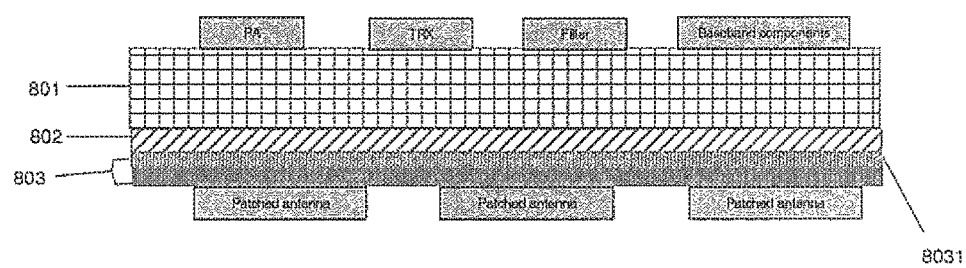
FIG. 8 provides an explanatory structure of a communication node with assembled multi-layer PCB according to an embodiment of the disclosure.

Alternatively as shown in FIG. 8, with the isolator layer (802) in between the radio layers (801) and the at least one antenna layer (803), ground planes respectively included in the multiple radio layers and the at least one antenna layer (such as shown as 8031) may remain their conventional designs such as metal area and thickness, to some extent lower down the complexity of the PCB design.

In a current AIR design, the filter unit is usually designed as a cavity filter which is known for low insertion loss and higher power handling ability. On the other hand, it is an unavoidable barrier to decrease the size of the AIR because of size limitation of cavity filter. Nowadays, new frequency band is introduced as ultra-high frequency and super-high frequency, such as radio frequency above 2~3 GHz as ultra-high frequency and above 3G as super-high frequency. With the new development of filter technology, filter can be mounted upon a surface of a PCB especially in high (above 3 MHz) frequency circumstances. Super-high and ultra-high frequency circumstances are now looking forward to a widespread use of the surface mounted filters.

Monoblock filter is an example of the surface mounted filters. Features such like fractional bandwidth, insertion loss, shape factor, out of band rejection and operating temperature range might be considered when selecting surface mounted filters. Dielectric filter is one of the preferable types. While there is high selectivity besides monoblok filter, alternatives such as Multilayer filter, Bulk Acoustic Waves (BAW) Filter, or Surface Acoustic Waves (SAW) Filter. For example, SAW Finite Impulse Response (FIR) filter or low loss filter, BAW filter on Quartz or on Lithium Tantalate (LT) are options of SAW and BAW filters, respectively.

Thus, when a PCB is assembled into a communication node, at least one radio component is mounted upon a surface layer of the multi-layer PCB, referring to FIG. 7 and FIG. 8, where a surface mounted filter is mounted upon the surface radio layer of the PCB as one of the at least one radio component. Other radio component would include one or more of:
a power amplifier (PA), and
a transceiver (TRX) component.

Transceiver transmits and receives signals to and from the baseband part. Power Amplifier is to amplify signals from TRX for transmission through antenna element(s).

According to another embodiment of the invention, the at least one radio component to be mounted on the surface of the radio layer comprises one or more baseband components which belong to the baseband part, as shown either FIG. 7 or FIG. 8. The baseband components comprise: Field Programmable Gate Array (FPGA), Digital Signal Processor (DSP), Central Process Unit (CPU) and Random Access Memory (RAM). In this case, the one or more baseband components play a role of baseband signal processing such as modulation/demodulation, encoding/decoding, pre-coding, channel estimation and equalization, which means that baseband functions are also integrated into a same multi-layer PCB with the radio function.

With the transceiver component and the baseband components mounted on a same surface layer of the PCB, the connection between the transceiver and the baseband components no longer relies on external optical fiber but wirings embedded in the PCB. In that way, hidden trouble to the reliability raised by external cable can be impeded, especially poor contact in the connector at the ends of the external cable. Meanwhile, cost of the long external cable can be saved.

An access node provided by the embodiments in the present disclosure can be smaller in size since the antenna part and the radio part are integrated into a same PCB, rooms for conventional connectors and jumper cables between the connectors can be saved, Moreover, weight of the access node will also be decreased with the removal of the conventional connectors and cables. Therefore, it will be easier to install a lighter and smaller access node as presented on the spot.

In another aspect, assembling difficulty is a big concern when connectors are assembled, especially a large number of pins plugging into holes densely arranged. It is frequently happened that some of the pins are misplaced when spacing of pins and spacing of holes are not exactly matching. With this invention, assembling of those connectors can be avoided.

In another aspect, cost of the access node can also be saved. An access node supporting N radio branches' transmission may need 2*N connectors because connector need to be applied for radio unit to filter unit connection, and filter unit to antenna unit connection. Assuming N is 128 which will be popularly supported in 5G, 256 connectors are needed for one access node. With an average price around U.S. $3 of a connector, material expense of U.S. $768 will be saved for a single access node, not to say the scrap of an entire N-head connector when some of the pins are misplaced during assembling.

In another aspect, connection reliability is also a problem of the conventional access node in a long-term concern. Insertion part of the pins is apt to be oxidized which might affect the conductivity. Influence on the connector from external environment such as severe weather might accelerate burn-in of the entire access node during its product lifetime. With the radio part and the antenna part integrated in a single PCB, reliability of the connection is enhanced.

In the present disclosure, a wireless communication node into which the multi-layer PCB is assembled is not limited to an access node. According to another embodiment of the invention, a wireless communication node can be a wireless terminal device of which a user equipment is a representative example. In 3G or 4G environment, a user equipment usually comprises two to four antenna elements at most, while in future development such as 5G deployment, number of antenna elements in a user equipment is anticipated to be 8, 16 or even more. Therefore, design of a surface antenna layer patched with multiple antenna elements is sound to minimize size of the user equipment with multiple antennas. What's more, besides the benefit discussed above, since connectors are saved in the PCB, yield rate of user equipment can be improved.

A wireless terminal device is provided which comprises:
a multi-layer PCB;
at least one radio component being mounted on a surface layer of the multi-layer PCB; and
an antenna element being patched on another surface layer of the multi-layer PCB.

The multi-layer PCB assembled in the user equipment comprises:
multiple radio layers (501) including the surface layer on which the at least one radio components are mounted; and
at least one antenna layer (502) including the other surface layer on which the at least one antenna element is patched.

In an embodiment of the wireless terminal device, the at least one radio component includes a surface mounted filter, such that the size of the terminal device can be considerably decreased. In that case, a user equipment such as mobile phone or mobile tablet can be thinner thus more popular as a portable device, catering to the needs of the users. Furthermore, the at least one radio component includes a TRX component. In circumstance that a Power Amplify (PA) is not mounted on the PCB, the TRX component not only transmits and receives RF signals through air interface, but amplifies RF signals before transmission. Further, baseband components are also mounted on the surface radio layer in the user equipment.

In a further embodiment of the disclosure which a wireless terminal device is provided, an isolation layer is in-between the multiple radio layers and the at least one antenna layer, to shield the multiple radio layers from radiation of the at least one antenna element. The isolation layer can be further connected to a shell of the user equipment. Respective ground plane of the multiple radio layers and the at least one antenna layer are also connected to the shell of the user equipment.

In an alternative embodiment of a wireless terminal device, ground planes of the multiple radio layers and the at least one antenna layer can be designed to minimize the affection of radiation to the radio components, such that an isolation layer is not necessary in the middle of the multi-layer PCB.

The disclosure has been described above with reference to embodiments thereof. It should be understood that various modifications, alternations and additions can be made by those skilled in the art without departing from the spirits and scope of the disclosure. Therefore, the scope of the disclosure is not limited to the above particular embodiments but only defined by the claims as attached.

The invention claimed is:

1. A multi-layer printed circuit board (PCB) in a wireless communication node, comprising:
    multiple radio layers on one side of the PCB, wherein at least one radio component is to be mounted on a surface layer of the multiple radio layers, and wherein the at least one radio component comprises a surface mounted filter; and
    at least one antenna layer on another side of the PCB, wherein an antenna element is to be patched on a surface layer of the at least one antenna layer.

2. The PCB in a wireless communication node according to claim 1, further comprising:
    an isolator layer between the multiple radio layers and the at least one antenna layer.

3. The PCB in a wireless communication node according to claim 1, wherein the multiple radio layers comprise a ground plane, and the at least one antenna layer comprises a ground plane layer.

4. The PCB in a wireless communication node according to claim 1, wherein the at least one radio components comprise one or more baseband components of: field-programmable gate array (FPGA), digital signal processor (DSP), central processing unit (CPU), and random-access memory (RAM).

5. The PCB in a wireless communication node according to claim 1, wherein the wireless communication node is a terminal device or an access node.

6. The PCB in a wireless communication node according to claim 2, wherein the multiple radio layers comprise a ground plane, and the at least one antenna layer comprises a ground plane layer.

7. A wireless communication node in wireless telecommunication system, the wireless communication node comprising:
    a multi-layer printed circuit board (PCB);
    at least one radio component being mounted on a surface layer of the multi-layer PCB wherein the at least one radio component comprises a surface mounted filter; and
    an antenna element being patched on another surface layer of the multi-layer PCB;
    wherein the multi-layer PCB comprising:
        multiple radio layers including the surface layer on which the at least one radio components are mounted; and
        at least one antenna layer including the other surface layer on which the at least one antenna element is patched.

8. The wireless communication node according to claim 7, wherein the multi-layer PCB further comprises:
    an isolator layer between the multiple radio layers and the at least one antenna layer.

9. The wireless communication node according to claim 7, wherein the multiple radio layers comprise a ground plane, and the at least one antenna layer comprises a ground plane layer.

10. The wireless communication node according to claim 7, wherein the at least one radio components comprise one or more baseband components of: field-programmable gate array (FPGA), digital signal processor (DSP), central processing unit (CPU), and random-access memory (RAM).

11. The wireless communication node according to claim 7, wherein the at least one antenna element comprises one or more of: high frequency antenna element, super high frequency antenna element or ultra high frequency antenna element.

12. The wireless communication node according to claim 7, wherein the wireless communication node is in a Multiple Input Multiple Output MIMO system.

13. The wireless communication node according to claim 7, wherein the wireless communication node is an access node or a terminal device.

14. The wireless communication node according to claim 8, wherein the multiple radio layers comprise a ground plane, and the at least one antenna layer comprises a ground plane layer.

* * * * *

UNITED STATES PATENT AND TRADEMARK OFFICE
CERTIFICATE OF CORRECTION

PATENT NO. : 10,201,073 B2
APPLICATION NO. : 15/515242
DATED : February 5, 2019
INVENTOR(S) : Xuejun Sun Page 1 of 1

It is certified that error appears in the above-identified patent and that said Letters Patent is hereby corrected as shown below:

On the Title Page

Item [57], Line 1, delete "Printed Circuit Board PCB" and insert -- Printed Circuit Board (PCB) --, therefor.

In the Specification

Column 5, Line 27, delete "monoblook" and insert -- monoblock --, therefor.

Column 6, Line 5, delete "saved, Moreover," and insert -- saved. Moreover, --, therefor.

In the Claims

Column 8, Line 16, Claim 7, delete "PCB wherein" and insert -- PCB, wherein --, therefor.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*